US007197732B2

(12) United States Patent
Murgai

(10) Patent No.: US 7,197,732 B2
(45) Date of Patent: Mar. 27, 2007

(54) LAYOUT-DRIVEN, AREA-CONSTRAINED DESIGN OPTIMIZATION

(75) Inventor: Rajeev Murgai, Santa Clara, CA (US)

(73) Assignee: Fujitsu Limited, Kawasaki (JP)

( * ) Notice: Subject to any disclaimer, the term of this patent is extended or adjusted under 35 U.S.C. 154(b) by 25 days.

(21) Appl. No.: 11/210,182

(22) Filed: Aug. 22, 2005

(65) Prior Publication Data

US 2006/0129960 A1 Jun. 15, 2006

Related U.S. Application Data

(60) Provisional application No. 60/636,319, filed on Dec. 14, 2004.

(51) Int. Cl.
*G06F 17/50* (2006.01)

(52) U.S. Cl. ................................ 716/6; 716/2; 716/18

(58) Field of Classification Search .................... 716/2, 716/6, 10, 18

See application file for complete search history.

(56) References Cited

U.S. PATENT DOCUMENTS

| | | | | |
|---|---|---|---|---|
| 6,286,128 B1 * | 9/2001 | Pileggi et al. | ................ | 716/18 |
| 6,557,145 B2 * | 4/2003 | Boyle et al. | .................... | 716/2 |
| 6,591,407 B1 * | 7/2003 | Kaufman et al. | ............. | 716/10 |
| 2001/0010090 A1 * | 7/2001 | Boyle et al. | .................... | 716/2 |
| 2005/0138578 A1 * | 6/2005 | Alpert et al. | .................. | 716/2 |

OTHER PUBLICATIONS

Alpert et al. "Wire Segmenting for Improved Buffer Insertion," DAC, pp. 588-593, 1997, 7 pages.

Alpert et al., "Buffer Insertion for Noise and Delay Optimization," DAC, pp. 362-367, 1998, 6 pages.

Alpert et al., "Fast and Flexible Buffer Trees that Navigate the Physical Layout Environment," DAC, pp. 24-29, 2004, 6 pages.

(Continued)

*Primary Examiner*—Thuan Do
*Assistant Examiner*—Binh Tat
(74) *Attorney, Agent, or Firm*—Baker Botts L.L.P.

(57) ABSTRACT

In one embodiment, a method for layout-driven, area-constrained design optimization includes accessing a design and a layout of the design. The design includes one or more gates and one or more nets coupling the gates to each other. The layout includes blocks that partition a chip area of the design. Each block includes one or more of the gates. The layout also includes a global routing of the nets. The method also includes performing a first timing analysis of the design and the layout and updating the design and the layout. The method also includes performing a second timing analysis of the design and the layout. The second timing analysis takes into account the updates to the design and the layout. The method also includes, if one or more results of the second timing analysis indicate that the design does not meet one or more predetermined design goals and indicate at least a predetermined amount of progress toward one or more of the design goals relative to the one or more results of the first timing analysis, further updating the design and the layout.

22 Claims, 5 Drawing Sheets

OTHER PUBLICATIONS

Kannan et al., "A Methodology and Algorithms for Post-Placement Delay Optimization," DAC, pp. 327-332, 1994, 6 pages.

Kung, "A Fast Fanout Optimization Algorithm for Near-Continuous Buffer Libraries," DAC, pp. 352-355, 1998, 4 pages.

Lillis et al., "Optimal Wire Sizing and Buffer Insertion for Low Power and a Generalized Delay Model," ICCAD, pp. 138-143, 1995, 8 pages.

Murgai, "Delay Constrained Area Recovery Via Layout-Driven Buffer Optimization," Intl. Conf. on VLSI Design, Jan. 2000, 8 pages.

Murgai, "Layout-Driven Area-Constrained Timing Optimization by Net Buffering," ICCAD, pp. 379-386, Nov. 2000, 7 pages.

Lukas, "Buffer Placement in Distributed RC-Tree Networks for Minimum Elmore Delay," ISCAS, pp. 865-868, 1990, 6 pages.

Rubinstein et al., "Signal Delay in RC Tree Networks," IEEE Trans. on CAD, Jul. 1983, 11 pages.

Tang et al., A New Algorithm for Routing Tree Construction with Buffer Insertion and Wire Sizing Under Obstacle Constraints,: ICCAD, pp. 49-56, 2001, 10 pages.

Vaishnav et al., "Routability-Driven Fanout Optimization," DAC, pp. 230-235, 1993, 8 pages.

* cited by examiner

LAYOUT-DRIVEN, AREA-CONSTRAINED DESIGN OPTIMIZATION

RELATED APPLICATION

This application claims the benefit, under 35 U.S.C. § 119(e), of U.S. Provisional Application No. 60/636,319, filed Dec. 14, 2004.

TECHNICAL FIELD OF THE INVENTION

This invention relates generally to circuit design and more particularly to layout-driven, area-constrained design optimization.

BACKGROUND

With the advent of deep submicron (DSM) technologies, interconnect loads and delays and layout-driven synthesis have become significant. However, because of tight layout constraints, e.g., area availability and congestion, only layout-friendly logic transforms such as net buffering and gate resizing are effective.

SUMMARY

According to the present invention, disadvantages and problems associated with circuit design may be reduced or eliminated.

In one embodiment, a method for layout-driven, area-constrained design optimization includes accessing a design and a layout of the design. The design includes one or more gates and one or more nets coupling the gates to each other. The layout includes blocks that partition a chip area of the design. Each block includes one or more of the gates. The layout also includes a global routing of the nets. The method also includes performing a first timing analysis of the design and the layout and updating the design and the layout as follows. Updating the design and the layout includes identifying all critical extended nets in the design. An extended net includes one net or two or more nets coupled to each other through buffers. Updating the design and the layout also includes ordering the critical extended nets. Updating the design and the layout also includes, for each of the critical extended nets, in the order, assigning polarities to sinks on the critical extended net, removing all buffers from the critical extended net, and updating the blocks in the layout spanned by the critical extended net according to the removal of buffers from the critical extended net. Updating the design and the layout also includes, if each block spanned by the critical extended net has no available area or includes only one net node for insertion of a buffer, applying to the critical extended net a modified van Ginneken algorithm for timing optimization or a modified global area algorithm for area minimization, and updating the blocks in the layout spanned by the critical extended net according to the application of the modified van Ginneken algorithm or the global area algorithm. Updating the design and the layout also includes, if the critical extended includes less than a first threshold number of net nodes and one or more blocks spanned by the critical extended net have at least some available area and include more than one net node, modifying the critical extended net so that each block spanned by the critical extended net has no available area or includes only one net node for insertion of a buffer, applying to the critical extended net the modified van Ginneken algorithm for timing optimization or the modified global area algorithm for area minimization, and updating the blocks in the layout spanned by the critical extended net according to the application of the modified van Ginneken algorithm or the modified global area algorithm. Updating the design and the layout also includes, if the critical extended net includes more than a second threshold number of net nodes and less than a third threshold number of net nodes, applying an exact Murgai buffering algorithm to the critical extended net and updating the blocks in the layout spanned by the critical extended net according to the application of the exact Murgai buffering algorithm. Updating the design and the layout also includes otherwise applying to the critical extended net a van Ginneken algorithm or a global area algorithm for timing optimization or a global area algorithm for area minimization that does not use illegal solutions at a root of the extended net, and updating the blocks in the layout spanned by the critical extended net according to the application of the van Ginneken algorithm or the global area algorithm. The method also includes performing a second timing analysis of the design and the layout. The second timing analysis takes into account the updates to the design and the layout. The method also includes, if one or more results of the second timing analysis indicate that the design meets all predetermined design goals or indicate no progress toward one or more of the design goals relative to one or more results of the first timing analysis, communicating the design and the layout for analysis. The method also includes, if one or more results of the second timing analysis indicate that the design does not meet one or more predetermined design goals and indicate at least a predetermined amount of progress toward one or more of the design goals relative to the one or more results of the first timing analysis, further updating the design and the layout.

Particular embodiments of the present invention may provide one or more technical advantages. As an example, particular embodiments address the problem of minimizing the delay of a mapped, roughly-placed and globally-routed design by buffer insertion and/or deletion without violating the local area constraints imposed by the layout. Particular embodiments make previous algorithms for timing optimization more practical by improving runtime without substantially sacrificing quality. Particular embodiments may provide speedups of 12.5 times the runtimes typically associated with previous algorithms for timing optimization.

Particular embodiments may provide all, some, or none of the technical advantages described above. Particular embodiments may provide one or more other technical advantages, one or more of which may be apparent, from the FIGURES, descriptions, and claims herein, to a person having ordinary skill in the art

BRIEF DESCRIPTION OF THE DRAWINGS

To provide a more complete understanding of the present invention and the features and advantages thereof, reference is made to the following description, taken in conjunction with the accompanying drawings, in which.

DESCRIPTION OF EXAMPLE EMBODIMENTS

Figure 1:
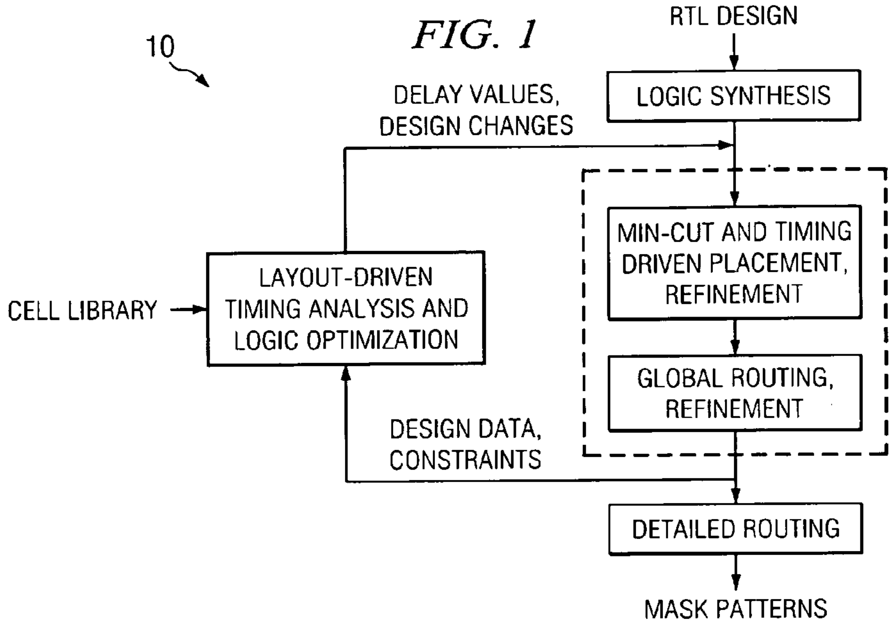
FIG. 1 illustrates an example design flow with layout-driven optimization.
Figure 2:
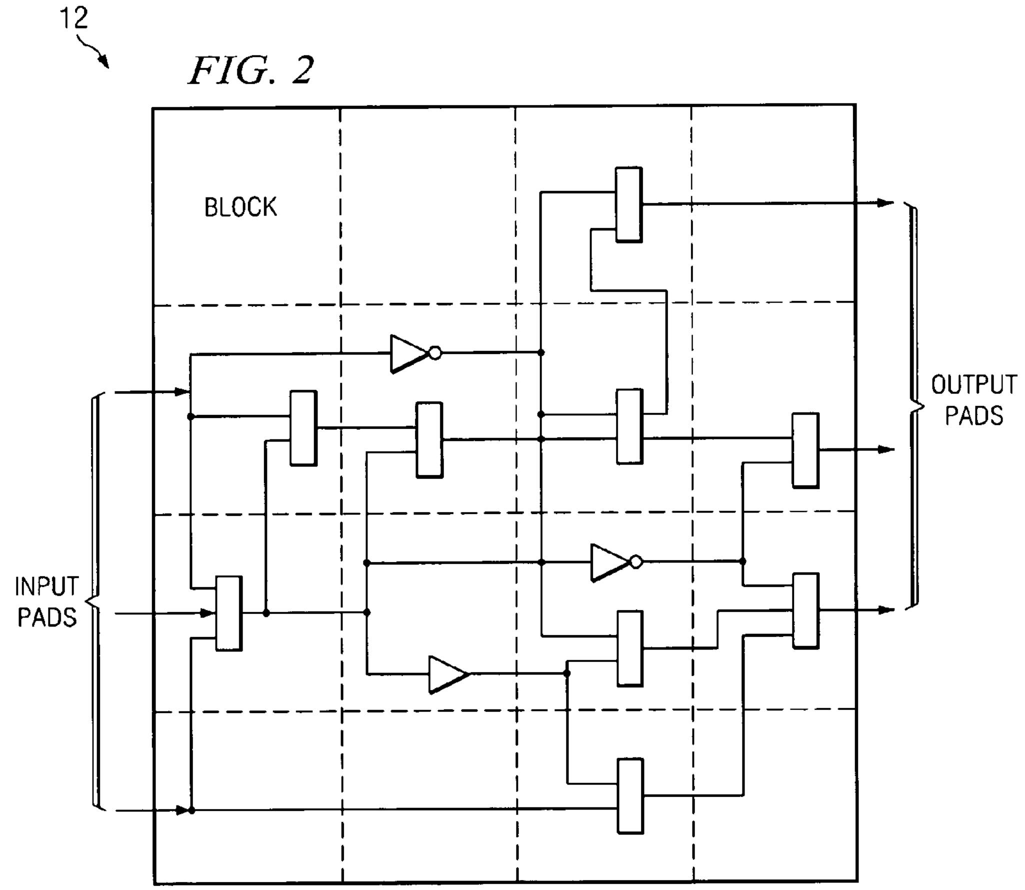
FIG. 2 illustrates an example block layout of a design.

FIG. 1 illustrates an example design flow 10. In particular embodiments of the present invention, given a logic-optimized, fully-mapped circuit, a min-cut based tool partitions the chip area into blocks using horizontal and vertical cuts. Reference to a tool encompasses a software, hardware, or embedded-logic component or a combination of two or more such components, where appropriate. One or more computer systems may provide one or more users access to a tool. Depending on the total chip area and the number of blocks, the placement tool assigns each block a fixed total area, which constrains the number and types of gates that can be placed in that block. Each gate of the circuit is placed in a block. A block may contain more than one gate. The topology and global routing of each net is then determined by a global routing tool, which generates net segments between blocks. This fully-mapped, block-placed and globally routed design forms a model 12, illustrated in FIG. 2. In particular embodiments of the present invention, an optimization methodology operates on model 12 as follows. The optimization methodology views designing a circuit as a unified task with certain goals. Examples of design goals include minimizing the circuit delay without violating the area, load and slew constraints, fixing timing violations, recovering maximum area without increasing the circuit delay, and fixing slew and overloading problems. A design goal may include a combination of one or more such design goals. Particular embodiments of the present invention use a series of optimizing steps to achieve design goals. Each step applies a transform (such as, for example, net buffering or gate resizing) to the design. The design changes resulting from these transforms along with the timing information are passed to the lay-out tool, which further refines the placement and global routing by generating more cuts, as illustrated in FIG. 1. The logic transformations may be invoked again on the refined design, with more accurate placement and wiring loads and delays. Thus, in particular embodiments of the present invention, the paradigm embeds specific logic transforms between successive refinement (or cut generation) phases of a min-cut based placement tool and a global routing tool.

Given a mapped, block-placed, and globally-routed design, particular embodiments of the present invention address the problem of minimizing its delay by buffer insertion and/or deletion subject to the area constraint. The area constraint stipulates that the area available in each block should not be less than the net area increase due to the buffers inserted in and deleted from the block by buffer optimization. If the area constraint for some block is not met, the modified design may be unrealizable. Satisfying the area constraint becomes more important when the design process is closer to the final layout.

Previous algorithms addressing the area-constrained net buffering problem work relatively well on a single net, but a drawback of such algorithms is their worst-case exponential runtime, which makes them impractical for large nets. Particular embodiments of the present invention employ techniques making such algorithms more practical by improving runtime without sacrificing quality, e.g., final delay and area. Particular embodiments of the present invention make use of a one-node-per-roomy-block (ONPRB) condition, which, if satisfied by the net, improves the worst-case runtime complexity to quadratic, without causing a substantial loss in optimality. To further reduce runtime, particular embodiments of the present invention employ a technique that converts a net into one that satisfies this condition.

In a physical synthesis design flow, a design is typically partitioned into possibly nonuniform blocks. A block is represented by (x, y) coordinates. The total area of a block P is denoted by T(P). T(P) is determined by a floor planning and placement tool, taking into account, among other things, the total chip area and the number of blocks. The area occupied by the cells and nets in the block P is the used area of the block U(P). The remaining area of P is the available area A(P), which may be used for inserting new cells or replacing existing ones with larger ones. A(P)=T(P)−U(P). The area constraint for block P mandates that the net area increase in P due to buffers inserted into or deleted from P must not exceed A(P).

Figure 3:
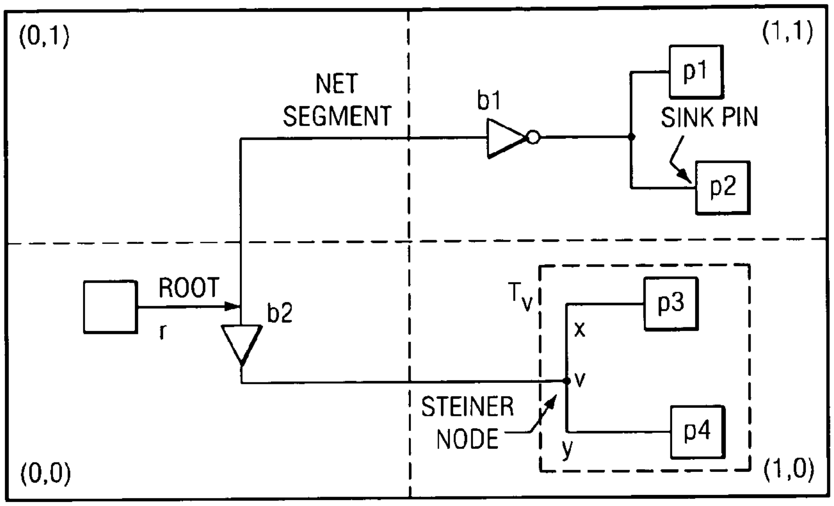
FIG. 3 illustrates an example extended net.
Figure 4:
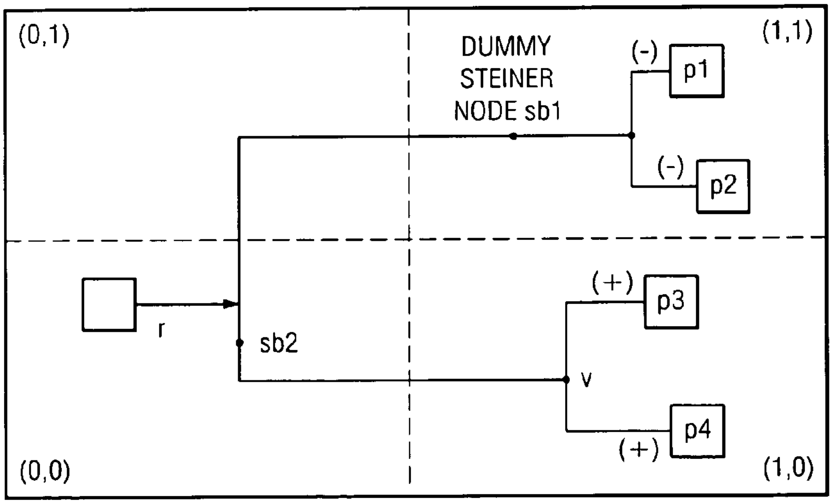
FIG. 4 illustrates an example representation of the extended net illustrated in FIG. 3.

A net segment is a horizontal or vertical piece of wire. A simple net is a set of net segments connecting cell pins and circuit pads to each other. A net has a driver (or root) and sink pins/pads. In a net, all net segment end-points that are not pins or pads are called Steiner nodes. All pins, pads, and Steiner nodes on a net are called net nodes. Since a net is a rooted tree, it makes sense to talk about children, parents, and ancestors of a net node. FIG. 3 illustrates an example node. In FIG. 3, x and y are children and r is an ancestor of v. The concept of a tree rooted at a net node is also used. For instance, $T_v$ is the tree rooted at the node v in FIG. 3. Let span $\gamma(v)$ denote the set of blocks spanned by $T_v$. FIG. 4 illustrates an example dummy node corresponding to the node illustrated in FIG. 3. In FIG. 4, $\gamma(S_{b_2})=\{(0, 0), (1, 0)\}$. An extended net is a generalized net that goes over buffers. Its sinks are either pads or input pins of non-buffer cells. FIG. 3 shows an extended net with root r and four sinks $p_1$ through $p_4$. It spans four blocks: (0, 0), (0, 1), (1, 0), and (1, 1). An extended net is represented as a regular net except that (1) each buffer b is replaced by a dummy Steiner node, e.g., buffers $b_1$ and $b_2$ in FIG. 3 are represented as $S_{b_1}$ and $S_{b_2}$ in FIG. 4, and (2) each sink p is assigned a positive (+) or a negative (−) polarity, depending on whether p receives a noninverted or an inverted signal from the driver. Steiner nodes, real or dummy, are the candidate locations on a net where new buffers may be inserted.

There are usually two main components of the circuit delay: pin-to-pin delay through the cells and interconnect delay. For an input pin i and an output pin o of a cell M, delay d(i, o) from i to o through M is given by $d(i, o)=\alpha_{io}+\beta_{io}c_o$. Here, $c_o$ is the load capacitance at o, $\alpha_{io}$ is the intrinsic delay from i to o, and $\beta_{io}$ is the corresponding load coefficient. These parameters are specified for all input to output arcs of each cell in the cell library. An Elmore delay model may be used for the interconnect.

Previous techniques for timing optimization target timing optimization without any regards to the area constraint, so they may insert buffers in blocks or locations where no area is available. Some of these techniques suggest associating a cost such as the number of buffers (or their areas) with each buffering solution, but do not address the problem of inserting buffers subject to the area availability in each local part of the design. Other previous techniques address the problem of buffer insertion in the presence of obstacles, but these works do not address the buffering problem in the presence of local area constraints. In contrast, particular embodiments of the present invention automatically handle obstacles since the reduced areas available in the related blocks due to obstacles are used in such embodiments.

Figure 5:
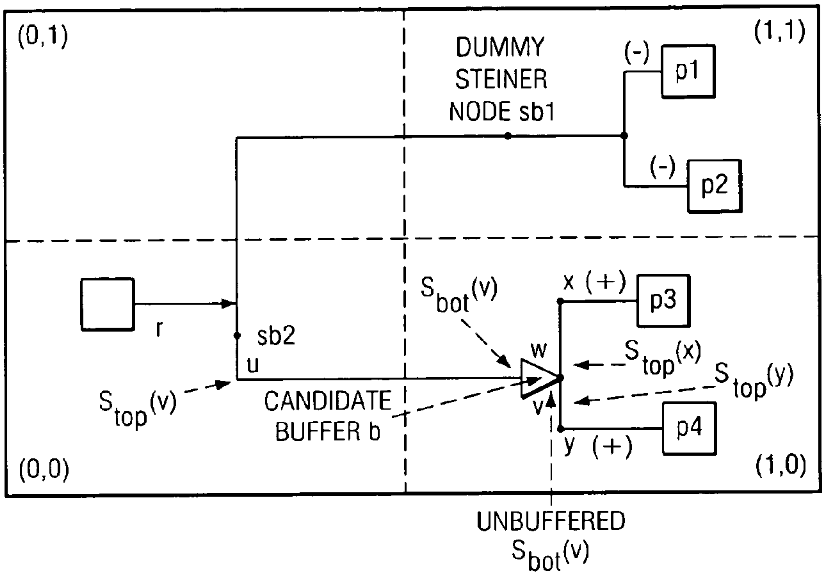
FIG. 5 illustrates example solution computation for node v in the extended net illustrated in FIG. 3.

Given a net N with n nodes and a library with l buffers, there are $(l+1)^n$ buffering solutions for N. Previous techniques for timing optimization include an exact polynomial-time dynamic programming algorithm for optimizing timing on N by buffering. Given required times at each net sink of N and a buffer library, the algorithm generates the optimum choice and locations of buffers that maximize the required time at the root r. It traverses net nodes of N bottom-up: starting from sinks and proceeding towards the root. At an intermediate node (such as a Steiner node) v, there are (l+1) possibilities corresponding to inserting any of the l buffers and not inserting any buffer at v. The algorithm constructs a set of solutions S(v) at v to capture all these possibilities. A solution at node v is a pair (c, q), where c is the capacitance of the tree $T_v$ rooted at v and q is the required time at v. S(v) is constructed from the solution sets of v's children and the buffering possibilities at v by appropriately incorporating capacitances of and delays through the wires and the buffer at v, as illustrated in FIG. 5. Each solution has children pointers to solutions that generated it. S(v) captures all buffering possibilities at the net nodes in $T_v$. Most of the solutions could be thrown away, as they were provably sub-optimal. For (c, q), (c', q') $\in$S(v), if (c'$\geqq$c') and (q'<q)) or (c'$\geqq$c) and (q'$\leqq$q)), then (c', q') is sub-optimal or inferior. Eventually, the root r is visited and S(r) constructed. The solution in S(r) that maximizes the required time at the parent cell of r is the optimum solution for the net N. Following the children pointers of this solution recursively, net nodes are identified where and which buffers should be inserted. This algorithm has quadratic run-time in the number of net nodes.

In particular embodiments of the present invention, a goal of area-constrained net buffering for timing optimization is to maximize the required time at the root of the net while satisfying the area constraint. Given an extended net N with its buffers already deleted, updated available areas A(P) for each block P of the design, and node v of N, $\sigma \in S(v)$ is a legal solution if after inserting buffers in $T_v$ as recommended by σ and updating the affected block areas, $A(P) \geqq 0$ for all P. Otherwise, σ is illegal. Informally, a legal solution corresponds to a buffering choice that does not violate block area constraints.

Previous techniques for timing optimization include an exact algorithm for the area-constrained buffering problem for a single net. Reference to an exact Murgai buffering algorithm encompasses such an algorithm, where appropriate. Such an algorithm traverses the net nodes in a topological order, from sinks to the root. At a net node, the algorithm first generates all legal solutions (but no illegal solution) and then throws away inferior solutions. At the root, the algorithm picks the optimum legal solution. A net node v, which is in block P, is processed, as illustrated in FIG. 5. With each solution $\sigma_v$ of S(v), a block area usage table $H_v$ is maintained. This table captures the area resources required by the buffering solution $\sigma_v$ for each block spanned by the sub-tree $T_v$ rooted at v. For each block Q $\in\gamma(v)$, $H_v$ stores in $H_v(Q)$ the combined area of all the buffers to be inserted by $\sigma_v$ in the block Q. Thus, $\sigma_v=(c_v, q_v, H_v)$. Although $\sigma_v$ appears to be a triple, it is not, since $H_v$ can contain multiple entries. In fact, $\sigma_v$ has $2+|\gamma(v)|$ components.

For $\sigma_v=(c_v, q_v, H_v)$, the table $H_v$ is generated as follows. If v is a sink node, $H_v$ is empty. For an intermediate node v, there are two possibilities:

(1) $\sigma_v$ is an unbuffered solution, generated by combining solutions $\sigma_z=(c_z, q_z, H_z)$ at x and $\sigma_y=(c_y, q_y, H_y)$ at y, where x and y are children of v. Since solution construction proceeds from net sinks to the root, $H_z$ and $H_y$ have already been constructed. Then, $H_v$ is generated as follows. For each block Q $\in\gamma(v)$:
if neither $H_z(Q)$ nor $H_y(Q)$ exists, do not create $H_v(Q)$;
if $H_z(Q)$ exists, but $H_y(Q)$ does not, $H_v(Q)=H_z(Q)$;
if $H_y(Q)$ exists, but $H_z(Q)$ does not, $H_v(Q)=H_y(Q)$;
otherwise, $H_v(Q)=H_z(Q)+H_y(Q)$.

(2) $\sigma_v$ is a buffered solution generated from an unbuffered solution $\eta_v=(c, q, H)$ by placing a buffer b at v. Then, $H_v(Q)=H(Q)\forall Q\neq P$, and $H_v(P)=H(P)+\text{area}(b)$. If H(P) does not exist, H(P)=area(b).

After generating $H_v$, it is checked if, for each Q $\in\gamma(v)$, $H_v(Q)\leqq A(Q)$. If so, $\sigma_v$ is legal. Otherwise, it is illegal and rejected. From the definition of the block area usage table, the following criterion of solution suboptimality or inferiority may be used:

Definition 1: Given two solutions $\sigma_1=(c_1, q_1, H_1)$ and $\sigma_2=(c_2, q_2, H_2)\in S(v)$, $\sigma_2$ is as good as $\sigma_1$ if 1) $c_1\geqq C_2$, and 2) $q_1\leqq q_2$, and 3) for each block Q$\in\gamma(v)$, $H_1(Q)\geqq H_2(Q)$. A non-existing entry is assumed to be zero. If an inequality is strict, $\sigma_1$ is cqH-inferior (sub-optimal) to $\sigma_2$.

The solution suboptimality criterion is relatively stringent, due to the comparison of all entries in $H_1$ and $H_2$. For a solution to be inferior, all of its block-area entries have to be worse, in addition to worse c and q entries. Thus, it may be that very few solutions are thrown away, which may lead to worst-case, exponential complexity.

The following definition relates to solution suboptimality:

Definition 2: Solution $\sigma_1=(c_1, q_1, H_1)$ at net node v is cq-inferior (or inferior with respect to c and q) if there exists another solution $\sigma_2=(c_2, q_2, H_2)$ at v such that $c_1\geqq c_2$, $q_1\leqq q_2$, and at least one inequality is strict.

Figure 6:
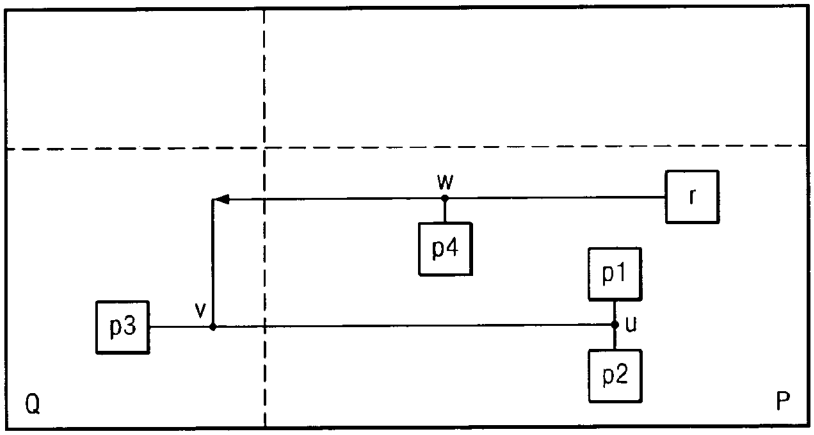
FIG. 6 illustrates example area contention in a block P.

Particular embodiments use a condition for the net, which, if satisfied, results in a polynomial-time exact algorithm for the timing-optimization problem. A reason for the exponential blow-up of algorithms used in previous timing-optimization techniques is the following: With each solution at a node v, the algorithm needs to remember the area used in each block in the span of the sub-tree $T_v$ rooted at v. This is to handle the case when there is a net node w, which is an ancestor node of v and is in a block P $\in\gamma(v)$. FIG. 6 illustrates example area contention in block P. In FIG. 6, r is the net root and $p_1$ through $p_4$ are the sinks. After solution generation at v, some of P's available area A(P) is already used up by buffering solutions at nodes $p_1$, $p_2$, and u. The node w is also contending for the same area resources. To make sure that no illegal solution is generated at w, how much area from A(P) has been used by σ is stored with each solution σ at nodes $p_1$, $p_2$, u, and v. The reason why using block area usages leads to exponential behavior follows: Although most of the solutions at v are cq-inferior (the basic result of a van Ginneken algorithm), these cannot be necessarily discarded, since their block area usages are different. It may happen that a solution $\sigma_1$ is cq-inferior to another solution $\sigma_2$, but is not cqH-inferior to $\sigma_2$. For instance, this can happen if $\sigma_2$ has used up more area in block P than $\sigma_1$. Assume w is driving a large capacitive load at $p_4$, as illustrated in FIG. 6. Then, inserting a buffer at w is most likely going to be beneficial. Unfortunately, $\sigma_2$ may not be able to generate a buffered solution at w, since it may not have sufficient area available in P for buffering. On the other hand, $\sigma_1$ may be able to generate such a buffered solution, thus leading to overall better delay for the net. As pointed out earlier, the criterion for cqH-inferiority is very stringent: a solution needs to have all its block-area entries worse, in addition to worse c and q entries. The greater the span of a net, the harder it becomes for a solution to be inferior. Then, relatively few solutions are thrown away, resulting in the exponential complexity.

In the above description, w, v's ancestor node, was required to be in a block P, where P is in the span of the sub-tree $T_v$ rooted at v. If a net N is such that each block Q spanned by N contains exactly one node of N, Q would be visited exactly once during the course of the algorithm: when the solutions for the net node v contained in Q are generated. No other net node of N has a contention for the area resources of Q. Hence, the block area usages need not be stored with each solution. The following modified van Ginneken algorithm may be used, which is similar to the original van Ginneken algorithm, with each solution having only two components c and q. The only modification needed is for the buffered solution generation. When trying to insert a buffer b at the node v in block Q, the algorithm performs an additional check: is it legal to insert buffer b, i.e., is the area A(Q) available in Q at least as much as the area of the buffer b? If so, buffered solutions may be generated at v for all the corresponding unbuffered solutions with buffer b. Thus, the legality check may be made for a solution at a node without using area usage information from any other node. In contrast, in the general case, the legality of a solution at a node v depends on the area used by other nodes that share v 's block.

Definition 3: A net N satisfies the ONPB condition if each block spanned by N contains exactly one net node.

Figure 7:
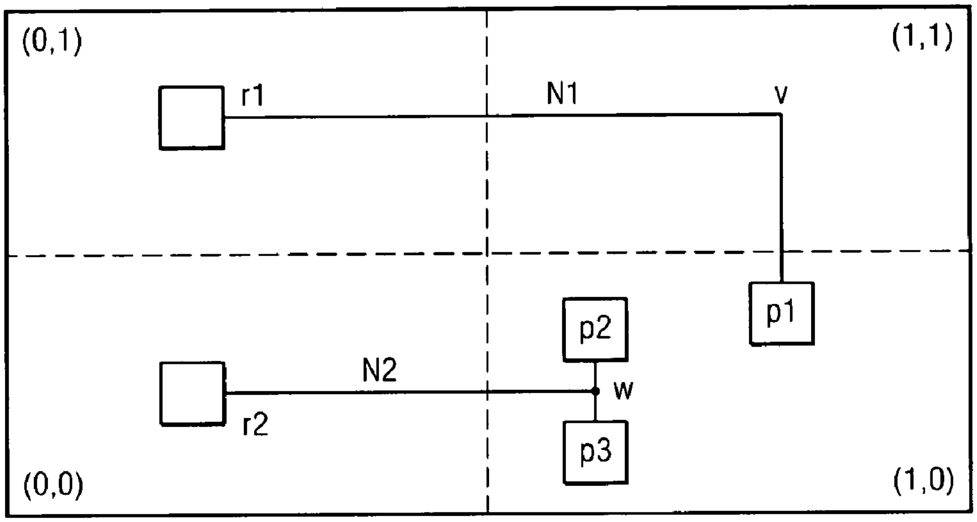
FIG. 7 illustrates example nets satisfying or not satisfying a one-node-per-block (ONPB) condition.

For instance, in FIG. 7, net $N_1$ satisfies the ONPB condition, since each of the net nodes $r_1$, v, and $p_1$ lies in a different block. The net $N_2$ does not satisfy the ONPB condition, since w, $p_2$ and $p_3$ all lie in the block (1, 0).

From the above description, the following proposition holds:

Proposition 1: If a net N satisfies the ONPB, the modified van Ginneken algorithm described above solves the single net area-constrained timing-oriented net buffering problem optimally in quadratic time.

The run-time complexity is the same as that of van Ginneken algorithm.

Note that the ONPB condition may be strengthened by allowing N to go over a block P with more than one net node, as long as P has no available area. The block area used here is the updated block area, i.e., after all the buffers originally present on N have been deleted in a pre-processing step.

Definition 4: A net N satisfies the ONPRB condition if each block P spanned by N either has no available area, i.e., A(P)=0, or contains exactly one net node.

The following proposition follows:

Proposition 2: If a net N satisfies the ONPRB condition, the modified van Ginneken algorithm described above solves the single net area-constrained timing-oriented net buffering problem optimally in quadratic time.

To further improve runtime, critical nets that do not satisfy the ONPRB condition may be modified so that they do. The modification may be done in one of the following two ways:

(1) Change the cell placement, net topology, and/or routing so that no two net nodes belong to the same block. However, this may not be desirable, since it can degrade the design quality.

(2) For each block spanned by the net, allow buffer insertion on only one node. For instance, for the net $N_2$ in FIG. 7, if buffer insertion is disallowed on sink nodes $p_2$ and $p_3$, and allowed on w, $N_2$ will satisfy the ONPB condition.

Particular embodiments of the present invention use the second scheme, above. The main problem is to select one node per block where potential buffer insertion may be done. The nodes on a net may be one of the following types: pin and pad (source and sinks), branching Steiner node, intermediate Steiner node (on long net segments), and Steiner node immediately after a branching Steiner node (on one of the branches, e.g., node w in FIG. 5). As buffer insertion candidates, Steiner nodes immediately after a Steiner node and pads tend to be least effective in improving the net timing. So, least priority may be assigned to these two kinds of nodes. Steiner nodes and intermediate Steiner nodes tend to be most effective and hence are given top priority. Pins are assigned medium priority. Ties are broken by analyzing the subtree $T_v$ rooted at each node v as follows. The number of nodes in $T_v$ where buffers can be inserted and the total capacitance of $T_v$ (including all the sink and wire capacitances) are computed. From these, average capacitance per node is determined. The node with higher average capacitance is preferred as a buffer insertion candidate.

If a net does not satisfy the ONPRB condition, has a large node count, and spans several blocks, its solution generation may be restricted to improve runtime and memory usage. Solutions are generated using either only c and q, or c, q, and global area a components. The global area a represents the total area used by all the buffers in the sub-tree rooted at the current net node. Reference to a global area algorithm encompasses a buffering algorithm in which a solution contains c, q, and a components. After solutions have been generated at all net nodes, illegal solutions at the net root are discarded. The best legal solution is picked. Although this scheme introduces suboptimality, it can handle nets that could not be optimized earlier.

As an example and not by way of limitation, the following is a complete improved buffering algorithm for area-constrained timing optimization of a single net N:

1. assign sink polarities and remove all buffers on N (as illustrated in FIG. 4); update block areas;
2. if N satisfies the ONPRB condition, invoke modified van Ginneken algorithm; update block areas; return;
3. if N is small, make it satisfy the ONPRB condition; call modified van Ginneken algorithm; update block areas; return;
4. if N has an intermediate size, invoke exact Murgai algorithm, as described above; update block areas; return;
5. call van Ginneken or global area algorithm which does not use illegal solutions at the root of N; update block areas.

The algorithm incorporates all three improvements described above. The algorithm may be embedded in a global timing optimization algorithm (which may be executed by a timing optimization tool) for the entire design, an example of which is set forth below:

1. perform delay trace on block-placed, globally-routed design
2. repeat {
3. identify & order critical extended nets
4. for each net N in the order, apply above algorithm
5. perform delay trace
6. } until (no improvement in slack)
7. if (minimum circuit slack worsens)
8. identify offending nets and undo changes For design goal of area minimization, a similar methodology is used. However, instead of van Ginneken algorithm and modified van Ginneken algorithm, the global area algorithm and modified global area algorithms are used respectively. The modified global area algorithm is the same as the global area algorithm, except for one modification. The modification is in the buffered solution generation. When trying to insert a buffer b at a node v in a block Q, the algorithm performs an additional check: is it legal to insert buffer b, i.e., is the area A(Q) available in Q at least as much as the area of the buffer b? If so, buffered solutions may be generated at v for all the corresponding unbuffered solutions with buffer b. As an example and not by way of limitation, the following is a complete improved buffering algorithm for area minimization of a single net N:

1. assign sink polarities and remove all buffers on N (as illustrated in FIG. 4); update block areas;
2. if N satisfies the ONPRB condition, invoke modified global area algorithm; update block areas; return;
3. if N is small, make it satisfy the ONPRB condition; call modified global area algorithm; update block areas; return;
4. if N has an intermediate size, invoke exact Murgai algorithm for area minimization; update block areas; return;
5. call global area algorithm that does not use illegal solutions at the root of N; update block areas.

Figure 8:
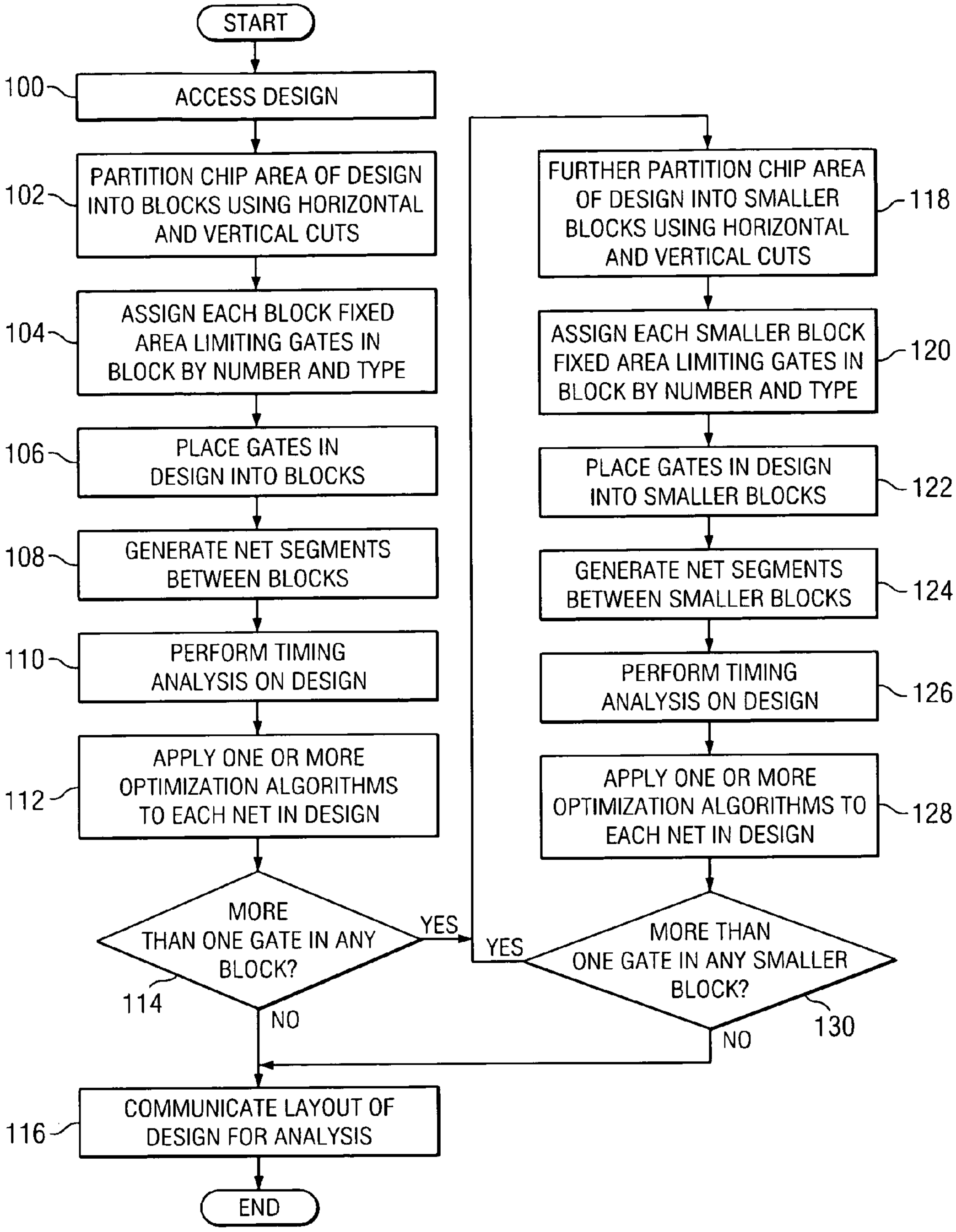
FIG. 8 illustrates an example method for layout-driven, area-constrained design optimization.

FIG. 8 illustrates an example method for layout-driven, area-constrained design optimization. The method begins at step 100, where a min-cut tool accesses a design of a logic-optimized, fully mapped circuit. At step 102, the min-cut tool partitions a chip area of the design into blocks using horizontal and vertical cuts. At step 104, a placement tool assigns each block a fixed area limiting gates in the block by number and type. At step 106, the placement tool places each gate in the design into a block. At step 108, a global routing tool generates net segments between the blocks to determine a topology and a global routing of each net in the design. At step 110, a timing analysis tool performs a timing analysis on the design. At step 112, an optimization tool applies one or more optimization algorithms to each net in the design. As an example and not by way of limitation, the optimization tool may apply a net buffering algorithm to each net in the layout of the design to minimize delay in the design without violating local area constraints imposed by the layout. At step 114, if each block includes no more than one gate, the method proceeds to step 116. At step 116, the optimization tool communicates the layout of the design for analysis, at which point the method ends.

At step 114, if one or more blocks each include more than one gate, the method proceeds to step 118. At step 118, the min-cut tool further partitions the chip area of the design into smaller blocks using horizontal and vertical cuts. At step 120, the placement tool assigns each smaller block a fixed area limiting gates in the smaller block by number and type. At step 122, the placement tool places each gate in the design into a smaller block. At step 124, the global routing tool generates net segments between the smaller blocks to determine a topology and a global routing of each net in the design. At step 126, the timing analysis tool performs a timing analysis on the design. At step 128, the optimization tool applies one or more optimization algorithms to each net in the design. As an example and not by way of limitation, the optimization tool may apply a net buffering algorithm to each net in the layout of the design to minimize delay in the design without violating local area constraints imposed by the layout. At step 130, if each smaller block includes no more than one gate, the method proceeds to step 116. At step 130, if one or more smaller blocks each include more than one gate, the method returns to step 118.

Although particular steps of the method illustrated in FIG. 8 have been illustrated and described as occurring in a particular order, the present invention contemplates any suitable steps of the method illustrated in FIG. 8 occurring in any suitable order.

Particular embodiments have been used to describe the present invention, and a person having skill in the art may comprehend one or more changes, substitutions, variations, alterations, or modifications to the particular embodiments used to describe the present invention. The present invention encompasses all such changes, substitutions, variations, alterations, and modifications within the scope of the appended claims.

What is claimed is:

1. Logic for layout-driven, area-constrained design optimization, the logic encoded in one or more media for execution and when executed operable to:

access a design and a layout of the design, the design comprising one or more gates and one or more nets coupling the gates to each other, the layout comprising blocks that partition a chip area of the design, each block comprising one or more of the gates, the layout further comprising a global routing of the nets;

perform a first timing analysis of the design and the layout;

update the design and the layout as follows:

identify all critical extended nets in the design, an extended net comprising one net or two or more nets coupled to each other through buffers;

order the critical extended nets;

for each of the critical extended nets, in the order:

assign polarities to sinks on the critical extended net;

remove all buffers from the critical extended net;

update the blocks in the layout spanned by the critical extended net according to the removal of buffers from the critical extended net;

if each block spanned by the critical extended net has no available area or includes only one net node for insertion of a buffer:

apply to the critical extended net a modified van Ginneken algorithm for timing optimization or a modified global area algorithm for area minimization; and update the blocks in the layout spanned by the critical extended net according to the application of the modified van Ginneken algorithm or the modified global area algorithm;

if the critical extended net comprises less than a first threshold number of net nodes and one or more blocks spanned by the critical extended net have at least some available area and include more than one net node:

modify the critical extended net so that each block spanned by the critical extended net has no available area or includes only one net node for insertion of a buffer;

apply to the critical extended net the modified van Ginneken algorithm for timing optimization or the modified global area algorithm for area minimization; and update the blocks in the layout spanned by the critical extended net according to the application of the modified van Ginneken algorithm or the modified global area algorithm;

if the critical extended net comprises more than a second threshold number of net nodes and less than a third threshold number of net nodes:

apply an exact Murgai buffering algorithm to the critical extended net; and update the blocks in the layout spanned by the critical extended net according to the application of the exact Murgai buffering algorithm; otherwise:

apply to the critical extended net a van Ginneken algorithm or a global area algorithm for timing optimization or a global area algorithm for area minimization that does not use illegal solutions at a root of the extended net; and update the blocks in the layout spanned by the critical extended net according to the application of the van Ginneken algorithm or the global area algorithm;

perform a second timing analysis of the design and the layout, the second timing analysis taking into account the updates to the design and the layout;

if one or more results of the second timing analysis indicate that the design meets all predetermined design goals or indicate no progress toward one or more of the design goals relative to one or more results of the first timing analysis, communicate the design and the layout for analysis; and if one or more results of the second timing analysis indicate that the design does not meet one or more predetermined design goals and indicate at least a predetermined amount of progress toward one or more of the design goals relative to the one or more results of the first timing analysis, further update the design and the layout.

2. The logic of claim 1, further operable to repeat operation until improvement in a minimum circuit slack as a result of the updates to the design and the layout reaches a predetermined threshold.

3. The logic of claim 1, further operable, if a minimum slack in the layout worsens as a result of the updates to the design and the layout, identify one or more nets in the design worsening the minimum slack in the design and undo the updates made to the design and the layout associated with the nets in the design worsening the minimum slack in the design.

4. The logic of claim 1, wherein the one or more design goals comprise one or more of:

minimizing delay in the design without violating an area, load, or slew constraint on the design;

fixing one or more timing violations in the design;

recovering a maximum area from the design without increasing delay in the design; and fixing one or more slew or overload problems in the design.

5. The logic of claim 1, operable, to modify the critical extended net so that each block spanned by the critical extended net has no available area or includes only one net node, to:

change placement of one or more gates associated with the critical extended net, change topology of the critical extended net, or change routing of the critical extended net; or insert one or more buffers into only one node in each block spanned by the critical extended net.

6. The logic of claim 5, further operable to select the node for insertion of the one or more buffers according to one or more criteria.

7. The logic of claim 1, wherein:

the modified van Ginneken algorithm generates a buffered solution differently from an original van Ginneken algorithm; and the modified global area algorithm generates a buffered solution differently from an original global area algorithm.

8. A method for layout-driven, area-constrained design optimization, the method comprising:

accessing a design and a layout of the design, the design comprising one or more gates and one or more nets coupling the gates to each other, the layout comprising blocks that partition a chip area of the design, each block comprising one or more of the gates, the layout further comprising a global routing of the nets;

performing a first timing analysis of the design and the layout;

updating the design and the layout as follows:

identifying all critical extended nets in the design, an extended net comprising one net or two or more nets coupled to each other through buffers;

ordering the critical extended nets;

for each of the critical extended nets, in the order:

assigning polarities to sinks on the critical extended net;

removing all buffers from the critical extended net;

updating the blocks in the layout spanned by the critical extended net according to the removal of buffers from the critical extended net;

if each block spanned by the critical extended net has no available area or includes only one net node for insertion of a buffer:

applying to the critical extended net a modified van Ginneken algorithm for timing optimization or a modified global area algorithm for area minimization; and updating the blocks in the layout spanned by the critical extended net according to the application of the modified van Ginneken algorithm or the modified global area algorithm;

if the critical extended comprises less than a first threshold number of net nodes and one or more blocks spanned by the critical extended net have at least some available area and include more than one net node:

modifying the critical extended net so that each block spanned by the critical extended net has no available area or includes only one net node for insertion of a buffer;

applying to the critical extended net the modified van Ginneken algorithm for timing optimization or the modified global area algorithm for area minimization; and updating the blocks in the layout spanned by the critical extended net according to the application of the modified van Ginneken algorithm or the modified global area algorithm;

if the critical extended net comprises more than a second threshold number of net nodes and less than a third threshold number of net nodes:

applying an exact Murgai buffering algorithm to the critical extended net; and updating the blocks in the layout spanned by the critical extended net according to the application of the exact Murgai buffering algorithm; otherwise:

applying to the critical extended net a van Ginneken algorithm or a global area algorithm for timing optimization or a global area algorithm for area minimization that does not use illegal solutions at a root of the extended net; and updating the blocks in the layout spanned by the critical extended net according to the application of the van Ginneken algorithm or the global area algorithm;

performing a second timing analysis of the design and the layout, the second timing analysis taking into account the updates to the design and the layout;

if one or more results of the second timing analysis indicate that the design meets all predetermined design goals or indicate no progress toward one or more of the design goals relative to one or more results of the first timing analysis, communicating the design and the layout for analysis; and if one or more results of the second timing analysis indicate that the design does not meet one or more predetermined design goals and indicate at least a predetermined amount of progress toward one or more of the design goals relative to the one or more results of the first timing analysis, further updating the design and the layout.

9. The method of claim 8, further comprising repeating operation until improvement in a minimum circuit slack as a result of the updates to the design and the layout reaches a predetermined threshold.

10. The method of claim 8, further comprising, if a minimum slack in the layout worsens as a result of the updates to the design and the layout, identifying one or more nets in the design worsening the minimum slack in the design and undoing the updates made to the design and the layout associated with the nets in the design worsening the minimum slack in the design.

11. The method of claim 8, wherein the one or more design goals comprise one or more of:

minimizing delay in the design without violating an area, load, or slew constraint on the design;

fixing one or more timing violations in the design;

recovering a maximum area from the design without increasing delay in the design; and fixing one or more slew or overload problems in the design.

12. The method of claim 8, wherein modifying the critical extended net so that each block spanned by the critical extended net has no available area or includes only one net node comprises:

changing placement of one or more gates associated with the critical extended net, change topology of the critical extended net, or change routing of the critical extended net; or inserting one or more buffers into only one node in each block spanned by the critical extended net.

13. The method of claim 12, further comprising selecting the node for insertion of the one or more buffers according to one or more criteria.

14. The method of claim 8, wherein:

the modified van Ginneken algorithm generates a buffered solution differently from an original van Ginneken algorithm; and the modified global area algorithm generates a buffered solution differently from an original global area algorithm.

15. A system for layout-driven, area-constrained design optimization, the system comprising:

an optimization tool operable to:

access a design and a layout of the design, the design comprising one or more gates and one or more nets coupling the gates to each other, the layout comprising blocks that partition a chip area of the design, each block comprising one or more of the gates, the layout further comprising a global routing of the nets;

perform a first timing analysis of the design and the layout;

update the design and the layout as follows:

identify all critical extended nets in the design, an extended net comprising one net or two or more nets coupled to each other through buffers;

order the critical extended nets;

for each of the critical extended nets, in the order:

assign polarities to sinks on the critical extended net;

remove all buffers from the critical extended net;

update the blocks in the layout spanned by the critical extended net according to the removal of buffers from the critical extended net;

if each block spanned by the critical extended net has no available area or includes only one net node for insertion of a buffer:

apply to the critical extended net a modified van Ginneken algorithm for timing optimization or a modified global area algorithm for area optimization; and update the blocks in the layout spanned by the critical extended net according to the application of the modified van Ginneken algorithm or the modified global area algorithm;

if the critical extended comprises less than a first threshold number of net nodes and one or more blocks spanned by the critical extended net have at least some available area and include more than one net node:

modify the critical extended net so that each block spanned by the critical extended net has no available area or includes only one net node for insertion of a buffer;

apply to the critical extended net the modified van Ginneken algorithm for timing optimization or the modified global area algorithm for area minimization; and update the blocks in the layout spanned by the critical extended net according to the application of the modified van Ginneken algorithm or the modified global area algorithm;

if the critical extended net comprises more than a second threshold number of net nodes and less than a third threshold number of net nodes:

apply an exact Murgai buffering algorithm to the critical extended net; and update the blocks in the layout spanned by the critical extended net according to the application of the exact Murgai buffering algorithm; otherwise:

apply to the critical extended net a van Ginneken algorithm or a global area algorithm for timing optimization or a global area algorithm for area minimization that does not use illegal solutions at a root of the extended net; and update the blocks in the layout spanned by the critical extended net according to the application of the van Ginneken algorithm or the global area algorithm;

perform a second timing analysis of the design and the layout, the second timing analysis taking into account the updates to the design and the layout;

if one or more results of the second timing analysis indicate that the design meets all predetermined design goals or indicate no progress toward one or more of the design goals relative to one or more results of the first timing analysis, communicate the design and the layout for analysis; and if one or more results of the second timing analysis indicate that the design does not meet one or more predetermined design goals and indicate at least a predetermined amount of progress toward one or more of the design goals relative to the one or more results of the first timing analysis, further update the design and the layout.

16. The system of claim 15, the optimization tool being further operable to repeat operation until improvement in a minimum circuit slack as a result of the updates to the design and the layout reaches a predetermined threshold.

17. The system of claim 15, the optimization tool being further operable, if a minimum slack in the layout worsens as a result of the updates to the design and the layout, identify one or more nets in the design worsening the minimum slack in the design and undo the updates made to the design and the layout associated with the nets in the design worsening the minimum slack in the design.

18. The system of claim 15, wherein the one or more design goals comprise one or more of:

minimizing delay in the design without violating an area, load, or slew constraint on the design;

fixing one or more timing violations in the design;

recovering a maximum area from the design without increasing delay in the design; and fixing one or more slew or overload problems in the design.

19. The system of claim 15, the optimization tool being operable, to modify the critical extended net so that each block spanned by the critical extended net has no available area or includes only one net node, to:

change placement of one or more gates associated with the critical extended net, change topology of the critical extended net, or change routing of the critical extended net; or insert one or more buffers into only one node in each block spanned by the critical extended net.

20. The system of claim 19, the optimization tool being further operable to select the node for insertion of the one or more buffers according to one or more criteria.

21. The system of claim 15, wherein:

the modified van Ginneken algorithm generates a buffered solution differently from an original van Ginneken algorithm; and the modified global area algorithm generates a buffered solution differently from an original global area algorithm.

22. A system for layout-driven, area-constrained design optimization, the system comprising:

means for accessing a design and a layout of the design, the design comprising one or more gates and one or more nets coupling the gates to each other, the layout comprising blocks that partition a chip area of the design, each block comprising one or more of the gates, the layout further comprising a global routing of the nets;

means for performing a first timing analysis of the design and the layout;

means for updating the design and the layout as follows:

identifying all critical extended nets in the design, an extended net comprising one net or two or more nets coupled to each other through buffers;

ordering the critical extended nets;

for each of the critical extended nets, in the order:

assigning polarities to sinks on the critical extended net;

removing all buffers from the critical extended net;

updating the blocks in the layout spanned by the critical extended net according to the removal of buffers from the critical extended net;

if each block spanned by the critical extended net has no available area or includes only one net node for insertion of a buffer:

applying to the critical extended net a modified van Ginneken algorithm for timing optimization or a modified global area algorithm for area minimization; and updating the blocks in the layout spanned by the critical extended net according to the application of the modified van Ginneken algorithm or the modified global area algorithm;

if the critical extended comprises less than a first threshold number of net nodes and one or more blocks spanned by the critical extended net have at least some available area and include more than one net node:

modifying the critical extended net so that each block spanned by the critical extended net has no available area or includes only one net node for insertion of a buffer;

applying to the critical extended net the modified van Ginneken algorithm for timing optimization or the modified global area algorithm for area minimization; and updating the blocks in the layout spanned by the critical extended net according to the application of the modified van Ginneken algorithm or the modified global area algorithm;

if the critical extended net comprises more than a second threshold number of net nodes and less than a third threshold number of net nodes:

applying an exact Murgai buffering algorithm to the critical extended net; and updating the blocks in the layout spanned by the critical extended net according to the application of the exact Murgai buffering algorithm; otherwise:

applying to the critical extended net a van Ginneken algorithm or a global area algorithm for timing optimization or a global area algorithm for area minimization that does not use illegal solutions at a root of the extended net; and updating the blocks in the layout spanned by the critical extended net according to the application of the van Ginneken algorithm or the global area algorithm;

means for performing a second timing analysis of the design and the layout, the second timing analysis taking into account the updates to the design and the layout;

means for, if one or more results of the second timing analysis indicate that the design meets all predetermined design goals or indicate no progress toward one or more of the design goals relative to one or more results of the first timing analysis, communicating the design and the layout for analysis; and means for, if one or more results of the second timing analysis indicate that the design does not meet one or more predetermined design goals and indicate at least a predetermined amount of progress toward one or more of the design goals relative to the one or more results of the first timing analysis, further updating the design and the layout.

* * * * *

UNITED STATES PATENT AND TRADEMARK OFFICE

CERTIFICATE OF CORRECTION

PATENT NO. : 7,197,732 B2 Page 1 of 1
APPLICATION NO. : 11/210182
DATED : March 27, 2007
INVENTOR(S) : Rajeev Murgai It is certified that error appears in the above-identified patent and that said Letters Patent is hereby corrected as shown below:

Column 5, Line 3, after “library” delete “with 1 buffers” and insert -- with $\ell$ buffers --.
Column 5, Line 4, after “are” delete “$(1+1)^n$” and insert -- $(\ell+1)^n$ --.
Column 5, Line 12, after “are” delete “(1+1)” and insert -- $(\ell+1)$ --.
Column 5, Line 13, after “the” delete “1” and insert -- $\ell$ --.
Column 12, Line 42, after “extended” insert -- net --.
Column 14, Line 36, after “extended” insert -- net --.
Column 16, Line 32, after “extended” insert -- net --.

Signed and Sealed this

Twenty-first Day of October, 2008

JON W. DUDAS
*Director of the United States Patent and Trademark Office*